(12) United States Patent
Lu et al.

(10) Patent No.: US 12,463,649 B2
(45) Date of Patent: Nov. 4, 2025

(54) DIGITAL PHASE-LOCKED LOOPS (PLL) INCLUDING CLOSED-LOOP TIME-TO-DIGITAL CONVERTER (TDC) GAIN CALIBRATION CIRCUITS AND RELATED METHODS

(71) Applicant: Microsoft Technology Licensing, LLC, Redmond, WA (US)

(72) Inventors: Ping Lu, Cary, NC (US); Minhan Chen, Cary, NC (US); Shaishav A. Desai, San Diego, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/385,729

(22) Filed: Oct. 31, 2023

(65) Prior Publication Data

US 2025/0141456 A1 May 1, 2025

(51) Int. Cl.
*H03L 7/107* (2006.01)
*G04F 10/00* (2006.01)
*H03L 7/085* (2006.01)
*H03L 7/099* (2006.01)

(52) U.S. Cl.
CPC .......... *H03L 7/1075* (2013.01); *G04F 10/005* (2013.01); *H03L 7/085* (2013.01); *H03L 7/0991* (2013.01)

(58) Field of Classification Search
CPC . H03L 2207/50; H03L 2207/00; H03L 7/087; H03L 7/085
See application file for complete search history.

(56) References Cited

U.S. PATENT DOCUMENTS 10,727,848 B2 * 7/2020 Dato ............... H03L 7/0992
2009/0074124 A1 3/2009 Henzler

FOREIGN PATENT DOCUMENTS

WO 2024182158 A1 9/2024

OTHER PUBLICATIONS

International Search Report and Written Opinion received for PCT Application No. PCT/US2024/049686, mailed on Jan. 21, 2025, 19 pages.

(Continued)

*Primary Examiner* — Diana J. Cheng
(74) *Attorney, Agent, or Firm* — NovoTechIP International PLLC

(57) ABSTRACT

In a calibrated digital phase-locked-loop (DPLL) circuit, during a normal operating mode, a control value provided to a digitally controlled oscillator (DCO) is updated by a feedback circuit to keep an output clock generated by the DCO synchronized with a reference clock. The feedback circuit includes a time-to-digital converter (TDC) circuit to measure a phase difference as a time interval. In a calibration operating mode of the calibrated DPLL circuit, calibration of a resolution of a time measurement of the time interval measured by the TDC is performed in the feedback circuit while the control value provided to the DCO is kept constant. Calibrating the TDCs in each of the DPLLs in an integrated circuit (IC) to a nominal resolution in this manner improves synchronization of the clock domains. In some examples, the TDC circuit is a Vernier type circuit and calibration sets a delay difference to a nominal resolution.

23 Claims, 9 Drawing Sheets

(56) References Cited

OTHER PUBLICATIONS

Lu, et al., "Reference Clock Jitter Immunity by Accurate DPLL Bandwidth Control in a Multiple-link Die-to-Die Interface", IEEE 66th International Midwest Symposium on Circuits and Systems (MWSCAS), Aug. 6-9, 2023, pp. 614-618.
Seong, et al., "A 320-fs RMS Jitter and—75-dBc Reference-Spur Ring-DCO-Based Digital PLL Using an Optimal-Threshold TDC", IEEE Journal of Solid-State Circuits, vol. 54, No. 9, Sep. 2019, pp. 2501-2512.

* cited by examiner

DIGITAL PHASE-LOCKED LOOPS (PLL) INCLUDING CLOSED-LOOP TIME-TO-DIGITAL CONVERTER (TDC) GAIN CALIBRATION CIRCUITS AND RELATED METHODS

FIELD OF THE DISCLOSURE

The technology of the disclosure relates, in general, to phase-locked loops (PLL) and, more particularly, to jitter response in digital PLLs (DPLLs).

BACKGROUND

Integrated circuits (ICs) can include multiple clock domains that communicate with each other. Each clock domain includes a group of digital logic circuits that are synchronized by switching in response to a common clock signal. Communication between the logic circuits of different clock domains relies on synchronization of (e.g., rising edges of) the clock signals of the respective clock domains. Clock domains may receive a same reference clock but each one has its own dedicated phase-locked loop (PLL) for generating a clock signal based on the reference clock and provides the clock signal to the circuits of its clock domain. A PLL may include a digitally controlled oscillator (DCO) that generates an output clock synchronized to the reference clock by a feedback circuit. The feedback circuit generates a feedback signal based on the output clock and detects an amount of time or time interval based on a phase difference between the reference clock and the feedback signal. A time-to-digital converter (TDC) in the feedback circuit takes a measurement of the time interval and provides the measurement as a digital control value to the DCO to cause the DCO to reduce the phase difference between the reference clock and the feedback signal.

When a digital PLL (DPLL) is initially powered on a time interval between the feedback signal and the reference clock may be a random value up to one reference clock. The feedback circuit gradually reduces the time interval until the DPLL is in a lock state, which is when the time interval between the reference clock and the feedback signal is reduced below a threshold. In the lock state, the reference clock and the output clock are considered to be "synchronized." Timing variations that occur in the reference clock, such as jitter, may cause the time interval (e.g., time difference between the feedback signal and the reference clock) to suddenly change, which changes the timing of the output clock edges of the DPLL. The manner in which the respective DPLLs in the different clock domains of an IC respond to jitter in the reference clock depends on the loop bandwidth of the DPLLs. The loop bandwidth is based on the gains of components of the DPLL, including the gain of the TDC. If the DPLLs in different clock domains of an IC receive the same reference clock but respond differently to jitter in the reference clock because they have different TDC gains, the jitter can cause timing problems that reduce performance or cause communication failures.

SUMMARY

Exemplary aspects disclosed herein include digital phase-locked loops (DPLLs) that include closed-loop time-to-digital converter (TDC) gain calibration circuits. Related methods of closed-loop TDC gain calibration are also disclosed. To optimize synchronization of interfaces between clock domains in an integrated circuit (IC), the gains of the TDC circuits in the DPLLs of each clock domain can be calibrated to a nominal resolution. In an exemplary calibrated DPLL circuit, calibration may be performed during operation of the DPLL in a calibration operating mode. During normal operating mode, a control value provided to a digitally controlled oscillator (DCO) may be updated by a feedback circuit to keep an output clock generated by the DCO in phase synchronization with a reference clock. In the exemplary calibrated DPLL circuit, the resolution of a time measurement of a time interval measured by the TDC is calibrated in a feedback circuit in the calibration operating mode while the control value provided to the DCO is kept constant. In this manner, in each of the DPLLs of the IC, the resolution of a measurement of a time interval generated by the TDC circuit is adjusted closer to a nominal resolution to improve synchronization of the clock domains.

In some examples, the TDC circuit employs a Vernier type of serially coupled delay circuits, wherein a maximum time measurement generated by the TDC circuit is based on a number of the serially coupled delay circuits. In such example, calibrating the resolution of the TDC circuit in the calibration operating mode includes feeding back an output of the serially coupled delay circuits, making it possible to measure a larger time interval that is a multiple of the maximum time measurement in the normal operating mode. The larger time measurement is compared to a known measurement based on a nominal resolution.

In one exemplary aspect, a calibrated phase-locked loop (PLL) comprising a digitally controlled oscillator (DCO) circuit and a feedback circuit is disclosed. The DCO is configured to generate a first output clock having a first frequency based on a control value. The feedback circuit is configured to, in a normal operating mode, generate a first measurement of a first time interval corresponding to a phase difference between the first output clock and a reference clock, and update the control value based on the first measurement. In a calibration operating mode, the feedback circuit is configured to keep the control value constant and adjust a first resolution of the first measurement to be closer to a nominal resolution.

In another exemplary aspect, a method of operating a calibrated PLL is disclosed. The method includes generating, in a digitally controlled oscillator (DCO) circuit, a first output clock having a first frequency based on a control value. The method further includes, in a normal operating mode of a feedback circuit, generating a first measurement of a first time interval corresponding to a phase difference between the first output clock and a reference clock, and updating the control value based on the first measurement. The method further includes, in a calibration operating mode of the feedback circuit, keeping the control value constant and adjusting a first resolution of the first measurement to be closer to a nominal resolution.

In another exemplary aspect, an integrated circuit comprising a plurality of clock domains is disclosed. Each clock domain of the plurality of clock domains comprises a calibrated phase-locked loop (PLL) and a plurality of digital logic circuits. The calibrated PLL comprises a digitally controlled oscillator (DCO) circuit configured to generate a first output clock having a first frequency based on a control value; and a feedback circuit. The feedback circuit is configured to, in a normal operating mode, generate a first measurement of a first time interval corresponding to a phase difference between the first output clock and a reference clock, and update the control value based on the first measurement and, in a calibration operating mode, keep the control value constant, and adjust a first resolution of the first measurement to be closer to a nominal resolution. The plurality of digital logic circuits are configured to operate in response to the first output clock, wherein the plurality of digital logic circuits of a first clock domain of the plurality of clock domains are configured to communicate with the plurality of digital logic circuits of a second clock domain of the plurality of clock domains.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 6:
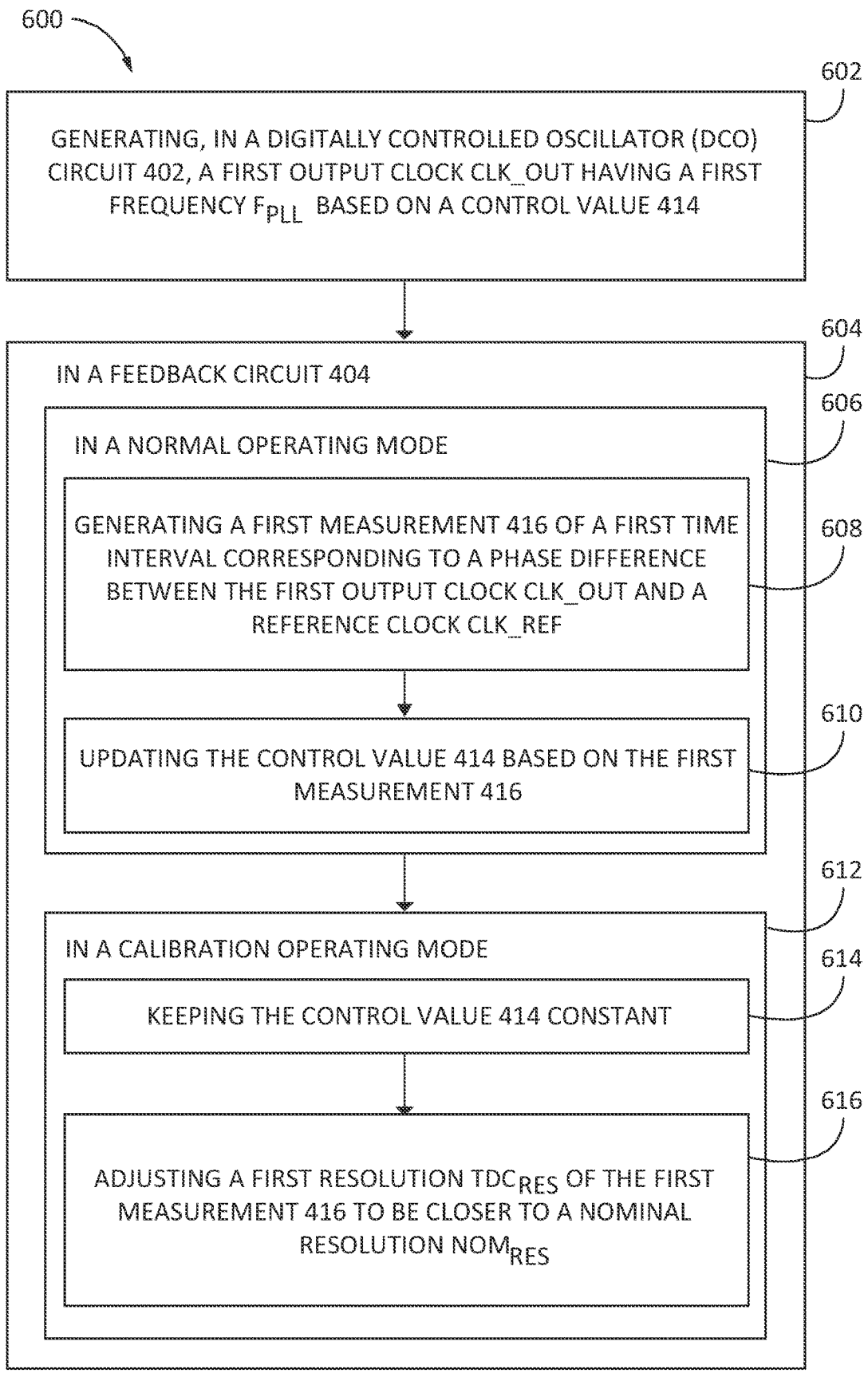
Figure 7:
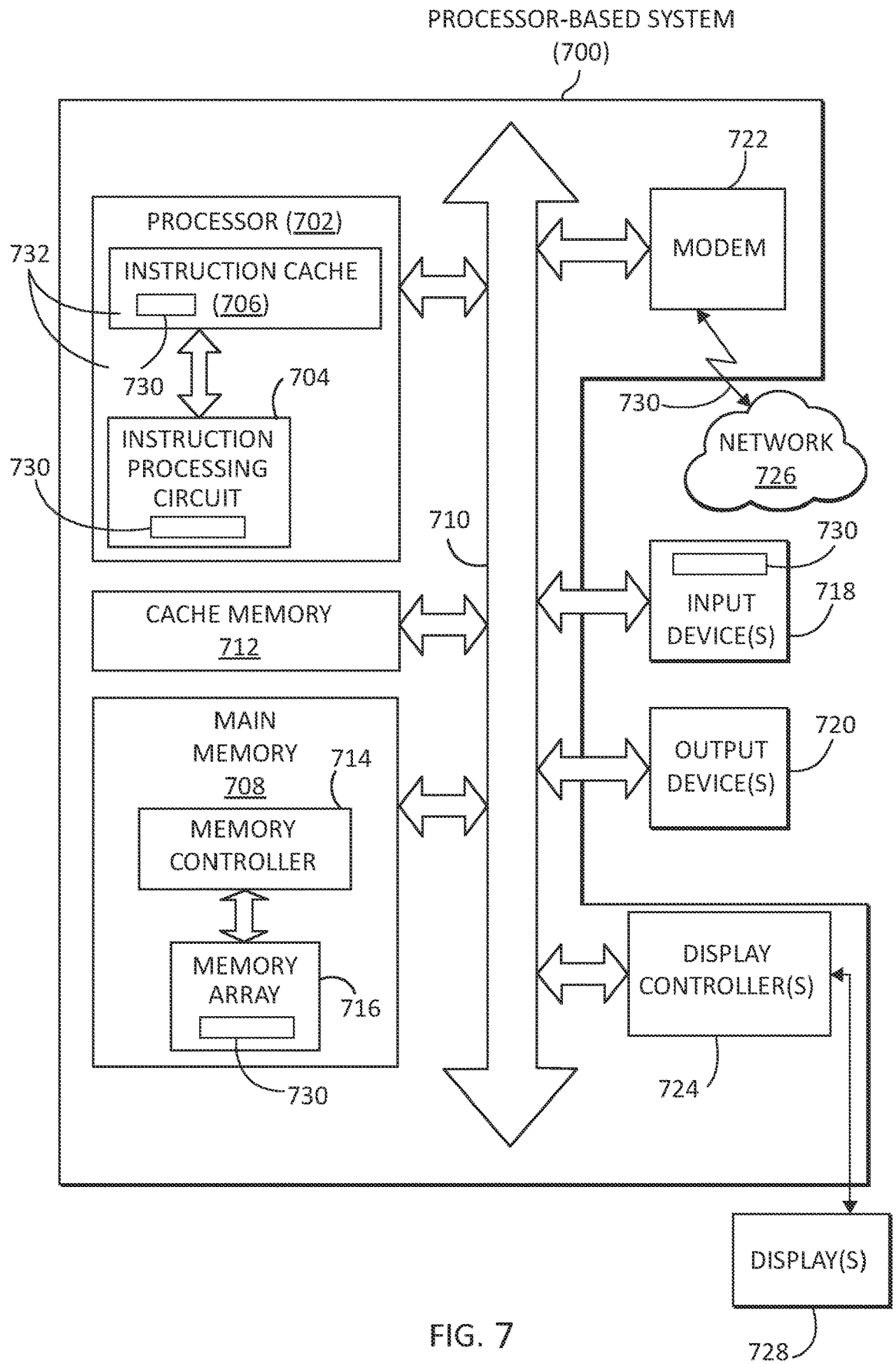

FIG. 6 is a flow chart illustrating a method of calibrating a resolution of a measurement of a time interval in a TDC circuit in a DPLL in a closed-loop method while the DCO continues to provide a constant output clock; and FIG. 7 is a block diagram of an exemplary processor-based system including a calibrated DPLL circuit including a digitally controlled oscillator (DCO), and a feedback circuit configured to synchronize an output clock with a reference clock in a normal operating mode and to calibrate resolution of a time measurement while providing a constant control value to the DCO in a calibration operating mode.

DETAILED DESCRIPTION

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include digital phase-locked loops (DPLLs) that include closed-loop time-to-digital converter (TDC) gain calibration circuits. Related methods of closed-loop TDC gain calibration are also disclosed. To optimize synchronization of interfaces between clock domains in an integrated circuit (IC), the gains of the TDC circuits in the DPLLs of each clock domain can be calibrated to a nominal resolution. In an exemplary calibrated digital phase-locked-loop (DPLL) circuit, during a normal operating mode, a control value provided to a digitally controlled oscillator (DCO) is updated by a feedback circuit to keep an output clock generated by the DCO synchronized with a reference clock. The feedback circuit includes a time-to-digital converter (TDC) circuit to measure a phase difference as a time interval. In a calibration operating mode of the calibrated DPLL circuit, calibration of a resolution of a time measurement of the time interval measured by the TDC is performed in the feedback circuit while the control value provided to the DCO is kept constant. Calibrating the TDCs in each of the DPLLs in an integrated circuit (IC) to a nominal resolution in this manner improves synchronization of the clock domains.

In some examples, the TDC circuit employs a Vernier type of serially coupled delay circuit, wherein a maximum time measurement generated by the TDC circuit in the normal operating mode is based on a number of the serially coupled delay circuits. In such an example, calibrating the resolution of the TDC circuit in the calibration operating mode includes feeding back an output of the serially coupled delay circuits, making it possible to measure a time interval that is a multiple of the maximum time measurement in the normal operating mode. A measurement of a larger time interval is employed to reduce a difference between the TDC resolution and a nominal resolution.

Figure 1:
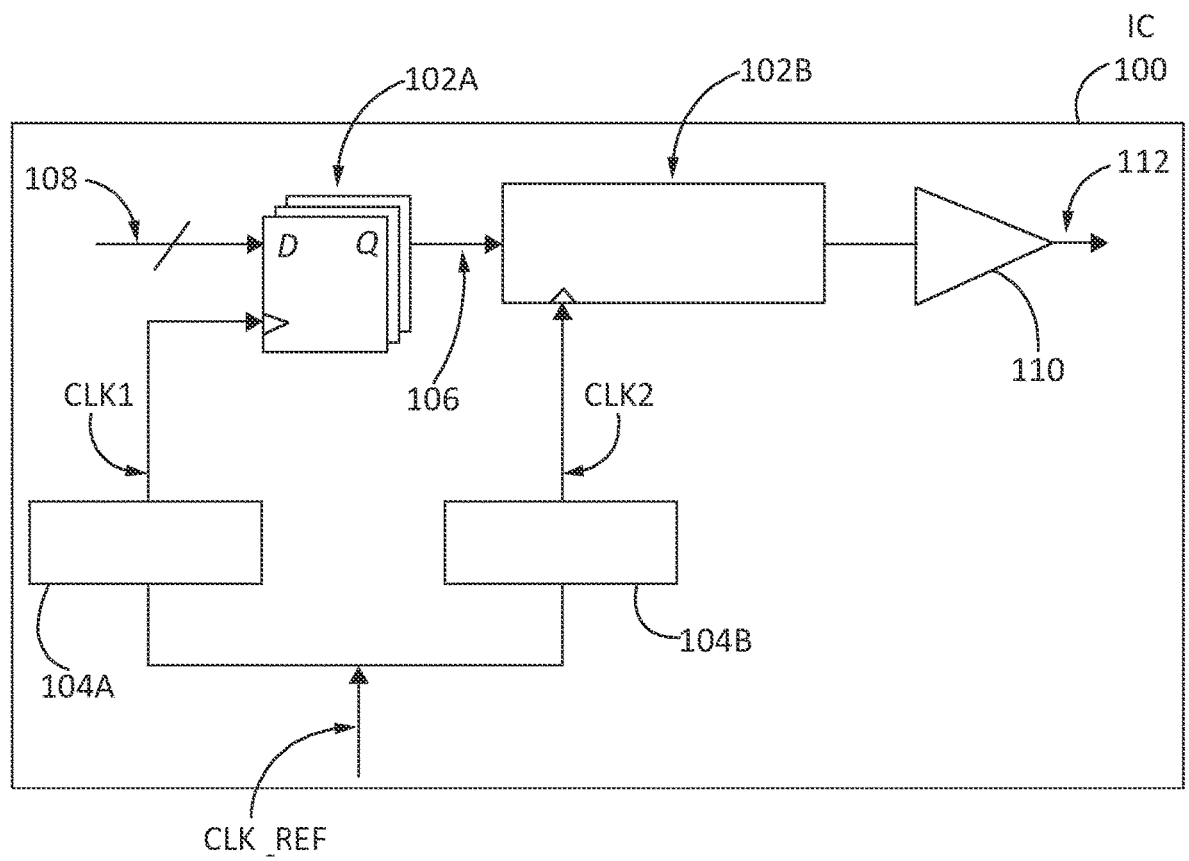
FIG. 1 is a block diagram of an IC including clock domain circuits receiving clocks generated by different digital phase-locked-loops (DPLL) and an inter-domain interface in which DPLL bandwidth alignment depends on calibration of the DPLLs.

FIG. 1 is a block diagram of an integrated circuit (IC) 100, including clock domain circuits 102A and 102B that operate in response to clocks CLK1 and CLK2, respectively. The clocks CLK1 and CLK2 are generated by digital phase-locked-loop circuits (DPLLs) 104A and 104B from a same reference clock CLK_REF. The clock domain circuits 102A and 102B communicate via an inter-domain interface 106, which is shown as unidirectional in FIG. 1 but may be bidirectional. As an example, the clock domain circuit 102A may include a register or series of data storage elements to store binary data 108 and the clock domain circuit 102B may include a serializer configured to receive binary data 108 and provide bits of the binary data 108 in series to a transmitter 110 for transmission on a serial interface 112. Performance of the inter-domain interface 106 may be optimized if the clocks CLK1 and CLK2 are synchronized. In particular, a maximum window in which data can be sampled/captured over the inter-domain interface 106 may be achieved if the rising edges of CLK1 and CLK2 are in phase synchronization and with small relative edge uncertainty. Ignorable relative edge uncertainty due to common reference clock may be achieved when the loop bandwidth of the DPLL 104A and the loop bandwidth of the DPLL 104B are the same. By calibrating each element of the DPLLs 104A and 104B to be equal or very close to a nominal value, CLK1 and CLK2 may be immune to reference clock jitter.

Figure 2:
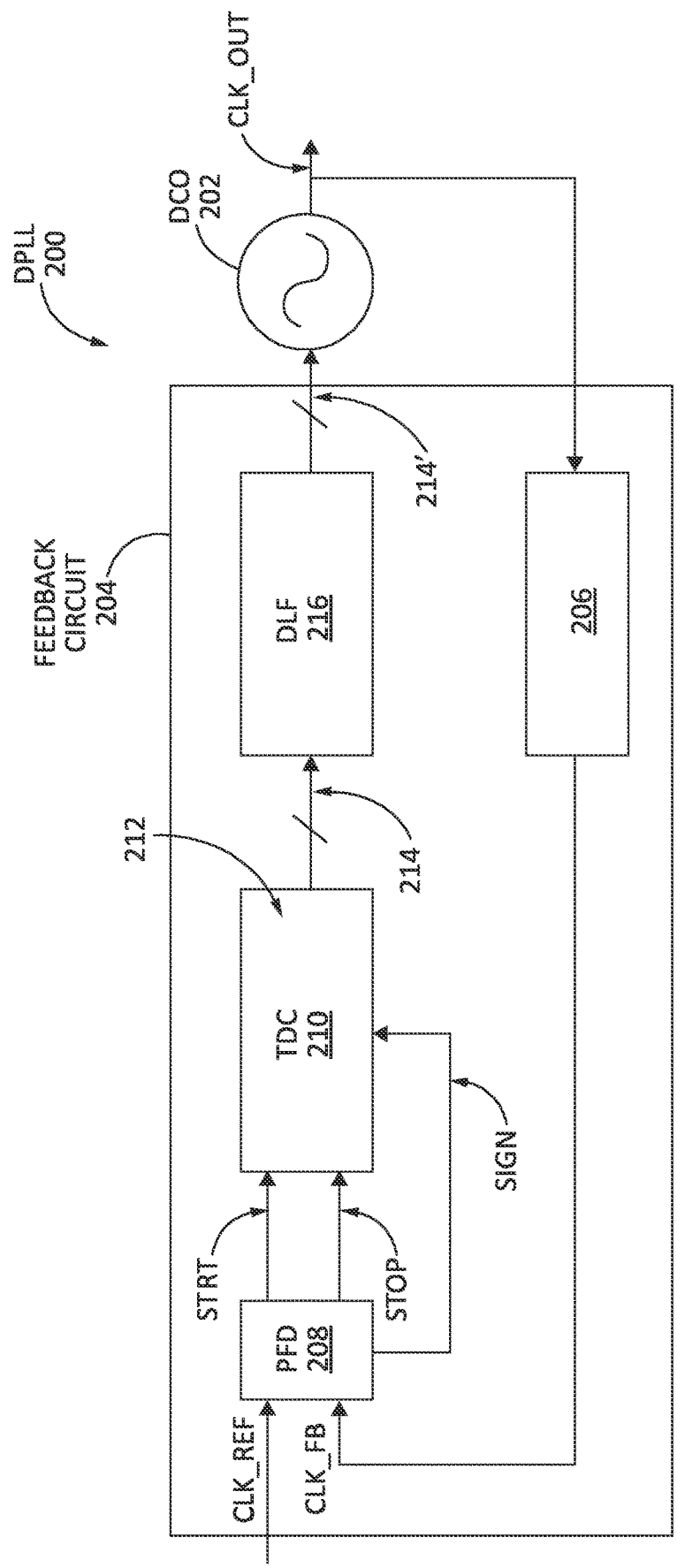
FIG. 2 is a schematic diagram of a conventional DPLL including a digitally controlled oscillator (DCO) and a feedback circuit to synchronize an output clock of the DPLL with a reference clock.

FIG. 2 is a schematic diagram of a conventional DPLL 200, including a digitally controlled oscillator (DCO) 202 and a feedback circuit 204 employed to attain and maintain a state of synchronization (e.g., "lock state") between an output clock CLK_OUT of the DCO 202 and a reference clock CLK_REF. The output clock CLK_OUT has a frequency $F_{PLL}$ with a cycle period of $T_{PLL}$. The feedback circuit 204 includes a divider circuit 206 that receives the output clock CLK_OUT and generates a feedback clock CLK_FB having a same phase as the output clock CLK_OUT. The divider circuit 206 divides the output clock CLK_OUT to generate the feedback clock CLK_FB at a lower frequency than the frequency $F_{PLL}$ of the output clock CLK_OUT. Frequency of output clock CLK_OUT may be based on a multiple of a frequency FREF of a reference clock CLK_REF, which is provided to the DPLL 200 by an external source, such as a crystal oscillator. In the example in FIG. 1, the reference clock CLK_REF may be provided to both of the DPLLs 104A and 104B.

The DPLL 200 includes a phase frequency detector (PFD) 208 that receives and detects a phase difference between the feedback clock CLK_FB and the reference clock CLK_REF. The PFD 208 generates a start signal STRT and a stop signal STOP that have rising edges (e.g., voltage steps) that are separated by an amount of time referred to herein as a "time interval" or "time difference" that corresponds to or indicates the detected phase difference between the feedback clock CLK_FB and the reference clock CLK_REF.

The DPLL 200 includes a time-to-digital converter circuit (TDC) 210 that receives the start signal STRT, the stop signal STOP, and a phase sign indicator SIGN from the PFD 208. The phase sign indicator SIGN indicates whether the phase difference is positive or negative, which is based on whether the feedback clock CLK_FB or the reference clock CLK_REF is leading in phase. The purpose of the TDC 210 is to measure the time interval between (e.g., rising edges of) the start signal STRT and the stop signal STOP. Variations in such measurement can determine how DPLLs in different clock domains respond to, for example, jitter in the reference clock CLK_REF. To avoid variations, the time interval needs to be measured as accurately as possible. The accuracy of such measurement is determined, in part, by a resolution $TDC_{RES}$ of the measurement, which is the smallest increment that may be indicated in a time measurement 212 generated by the TDC 210. The time measurement 212 is used to control and adjust (as needed) timing of the DCO 202 to reduce the time interval. In this regard, the time measurement 212 is binary data provided as a control value 214 to the DCO 202. The TDC 210 provides the control value 214 to a delay loop filter (DLF) 216 which may filter out noise in the time measurement 212 and provide the control value 214' (filtered) to the DCO 202.

Figure 3:
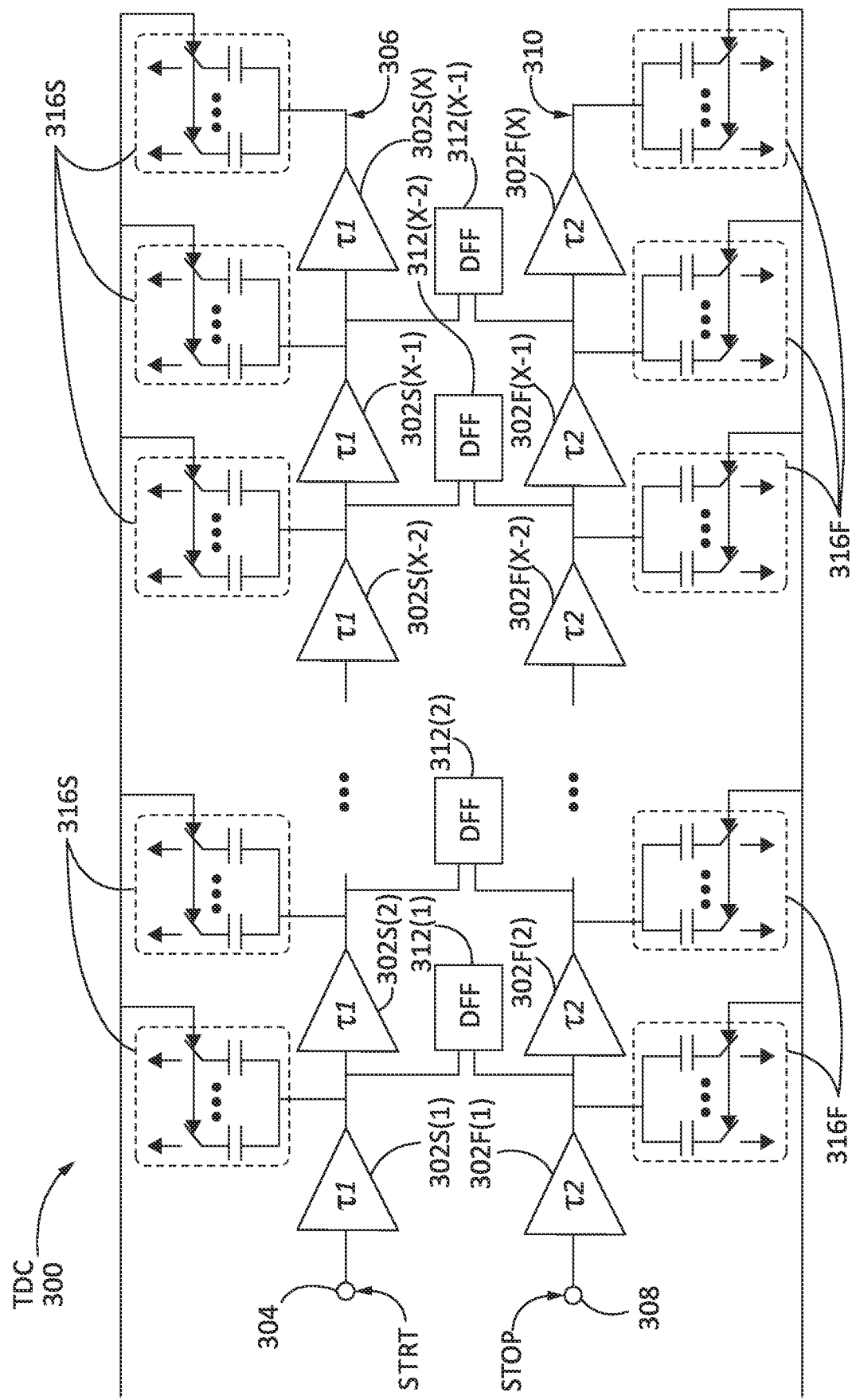
FIG. 3 is a schematic diagram of an exemplary time-to-digital converter (TDC) circuit that employs serially coupled delay circuits in a Vernier type circuit to generate a measurement of a time interval and which may be adjusted to calibrate resolution of the measurement to a nominal value.

FIG. 3 is a schematic diagram of an exemplary TDC 300 that employs serially coupled delay circuits 302S(1)-302S(X) and serially coupled delay circuits 302F(1)-302F(X) in a Vernier type circuit to measure a time interval or amount of time between the start signal STRT and the stop signal STOP and generate a time measurement (not shown) of the time interval. The term "serially coupled delay circuits" refers to a plurality of delay circuits coupled in series with an output of a given delay circuit coupled to an input of an immediately following delay circuit and an input of the given delay circuit coupled to the output of an immediately preceding delay circuit. Each of the serially coupled delay circuits 302S(1)-302S(X) have a first propagation delay $\tau 1$ and each of the serially coupled delay circuits 302F(1)-302F(X) have a second propagation delay $\tau 2$, with the first propagation delay $\tau 1$ being longer than the second propagation delay $\tau 2$. As known to persons having familiarity with Vernier type circuits, the start signal STRT is provided to an input 304 of the serially coupled delay circuit 302S(1) and arrives at an output 306 of the serially coupled delay circuit 302S(X) after a total propagation time of $\tau 1$ times X. After a time interval, the stop signal STOP is provided to an input 308 of the serially coupled delay circuit 302F(1) and propagates to an output 310 of the serially coupled delay circuit 302F(X) after a total propagation time of $\tau 2$ times X. As long as the time interval between the start signal STRT and the stop signal STOP is less than X times ($\tau 1$-$\tau 2$), the stop signal STOP will "catch up to" (e.g., propagate through a same number of delay circuits) the start signal STRT before the start signal STRT reaches the output 306 of the serially coupled delay circuit 302S(X). For this reason, the maximum measurable time $T_{MAX}$ of the TDC 300 is less than X times ($\tau 1$-$\tau 2$).

When the stop signal STOP propagates through a same number ("delay number") of the serially coupled delay circuits 302F(1)-302F(X) as the number of serially coupled delay circuits 302S(1)-302S(X) through which the start signal STRT has propagated, the storage circuits (e.g., D flip-flops) 312(1)-312(X-1) will indicate the delay number. The time measurement of the time interval between the start signal STRT and the stop signal STOP is determined multiplying the delay number by the time difference between the delays $\tau 1$ and $\tau 2$ ($\tau 1$-$\tau 2$) and the resolution $TDC_{RES}$ is the resolution of such indication. As shown in FIG. 3, each of the serially coupled delay circuits 302S(1)-302S(X) and 302F(1)-302F(X) are coupled to variable capacitors 316S and 316F, which may be used to adjust the propagation delays $\tau 1$ and $\tau 2$, respectively. An adjustment of the propagation delays $\tau 1$ and $\tau 2$ to change the difference $\tau 1$-$\tau 2$ may calibrate the resolution $TDC_{RES}$ of the time measurement. Calibrating the resolution $TDC_{RES}$ to a nominal value $NOM_{RES}$ in all of the DPLLs in an IC can increase the similarity with which they respond to jitter and other variations in the reference clock CLK_REF, providing improved synchronization between circuits of different clock domains.

Figure 4A:
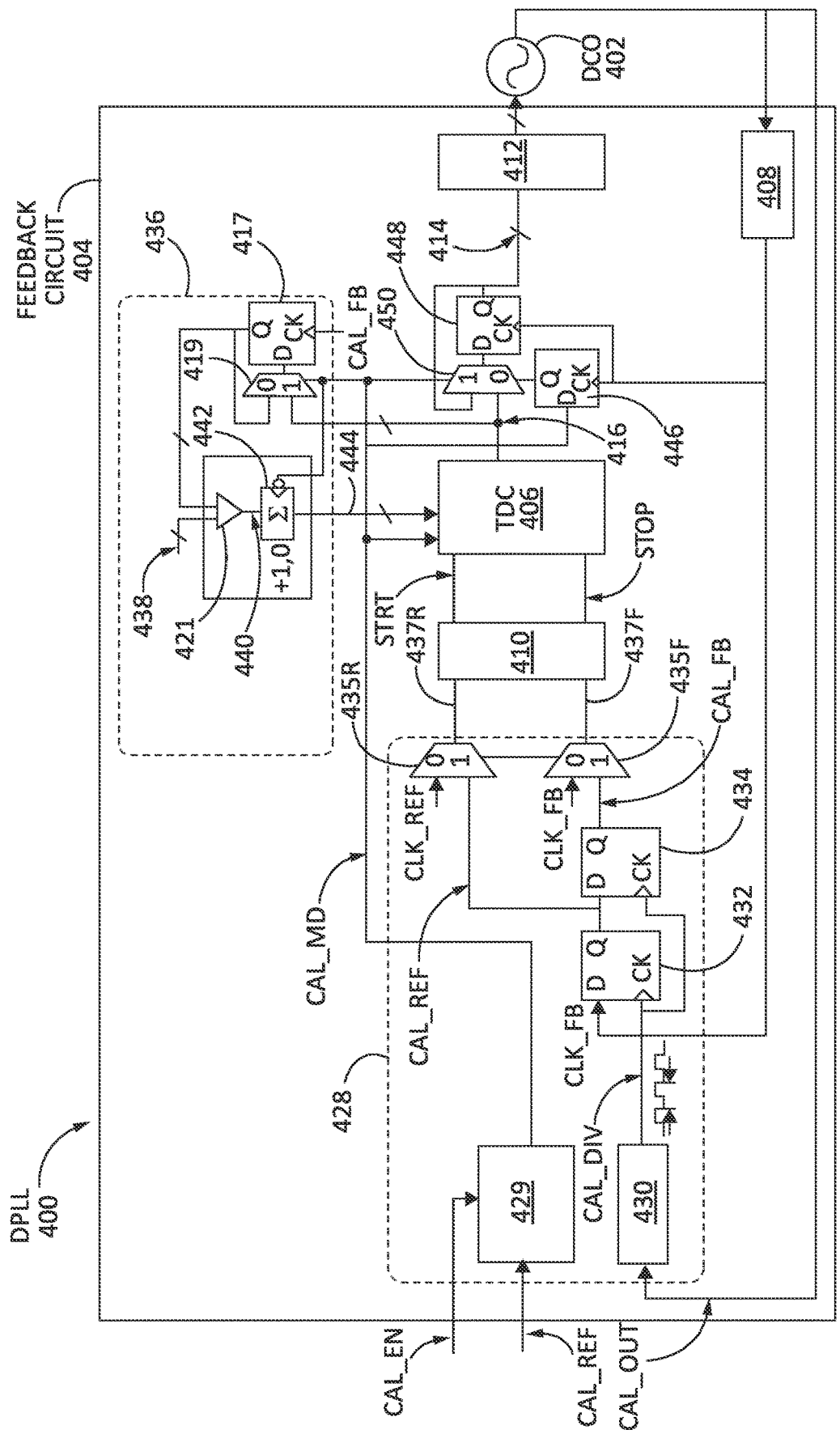
FIG. 4A is a schematic diagram of an exemplary calibrated DPLL circuit, including a digitally controlled oscillator (DCO) and a feedback circuit configured to operate in a normal operating mode and in a calibration operating mode to calibrate resolution of a time measurement in a closed-loop method while providing a constant control value to the DCO.

FIG. 4A is a schematic diagram of an exemplary calibrated DPLL 400 including a digitally controlled oscillator (DCO) 402 controlled by a feedback circuit 404 which includes a TDC 406. The DPLL 400 may be employed in the DPLLs 104A and 104B in FIG. 1. The feedback circuit 404 includes a divider circuit 408, a PFD 410, and a DLF 412 that function according to the descriptions of the divider circuit 206, the PFD 208, and the DLF 216, respectively, in FIG. 2. The DPLL circuit 400 is configured to operate in a normal operating mode and in a calibration operating mode. In both the normal operating mode and the calibration operating mode, the DCO 402 generates an output clock CLK_OUT having a frequency $F_{PLL}$ based on a control value 414 provided by the feedback circuit 404. In the normal operating mode, the feedback circuit 404 receives the output clock CLK_OUT and a reference clock CLK_REF, generates the feedback clock CLK_FB having a rising edge synchronized with a rising edge of the output clock CLK_OUT, and generates a measurement 416 based on a phase difference between the feedback clock CLK_FB and the reference clock CLK_REF. Specifically, the PFD 410 determines a phase difference between the output clock CLK_FB and the reference clock CLK_REF and generates the start signal STRT and the stop signal STOP separated by an amount of time (e.g., a "time interval") corresponding to the phase difference. The time interval between the start signal STRT and the stop signal STOP may be directly related to the phase difference between the feedback clock CLK_FB and the reference clock CLK_REF. The TDC 406 updates the measurement 416 based on the time interval each time there is a measurable change in the time interval and updates the control value 414 based on the measurement 416. The control value 414 may be the measurement 416, modified or unmodified, used to control or adjust the frequency $F_{PLL}$ and/or a phase of the output clock CLK_OUT to bring the output clock CLK_OUT into phase synchronization or "lock state" with a reference clock CLK_REF and maintain such state.

In the calibration operating mode, the DCO 402 is still generating the output clock CLK_OUT, so the clock domain circuits (not shown) that receive the output clock CLK_OUT can continue to operate. However, the control value 414 is kept constant, causing the DCO 402 to continue to generate an output clock CLK_OUT having a constant phase and frequency $F_{PLL}$. In this mode, the TDC 406 is not being used to compare the feedback clock CLK_FB to the reference clock CLK_REF, but to detect a fixed time interval which is equal to the period of CAL_DIV (M times of $T_{PLL}$), so that a resolution $TDC_{RES}$ of the TDC 406 can be adjusted (e.g., "calibrated") to be closer to a nominal resolution $NOM_{RES}$ in a closed-loop method.

The calibration performed in the feedback circuit 404 includes comparing the actual resolution $TDC_{RES}$ to the nominal resolution $NOM_{RES}$ and adjusting the resolution $TDC_{RES}$ to be closer to the nominal resolution $NOM_{RES}$. In particular, a measurement of an amount of time that is a multiple (J) of the resolution $TDC_{RES}$ is compared to a known measurement of the same amount of time provided as a multiple (K) of the nominal resolution $NOM_{RES}$. If the multiple (J) and the multiple (K) are equal, the resolution $TDC_{RES}$ and the nominal resolution $NOM_{RES}$ differ by less than $NOM_{RES}/K$. It should be understood that, as the multiple (K) increases, smaller differences between the resolution $TDC_{RES}$ and the nominal resolution $NOM_{RES}$ can be detected. Therefore, by increasing the amount of time measured with both the resolution $TDC_{RES}$ and the nominal resolution $NOM_{RES}$, the difference between the resolution $TDC_{RES}$ and the nominal resolution $NOM_{RES}$ is reduced. In this manner, the resolution $TDC_{RES}$ can be more closely calibrated to the nominal resolution $NOM_{RES}$. However, as described above with reference to FIG. 3, in the normal operating mode, the maximum measurable time $T_{MAX}$ that may be measured by the TDC 300 is based on the resolution $TDC_{RES}$ times the number (X) of serially coupled delay circuits 302S(1)-302S(X) and 302F(1)-302F(X). It would increase the cost and design complexity of the TDC 300 to significantly increase the number (X) of the serially coupled delay circuits 302S(1)-302S(X) and 302F(1)-302F(X) only for the purpose of such calibration.

Figure 4B:
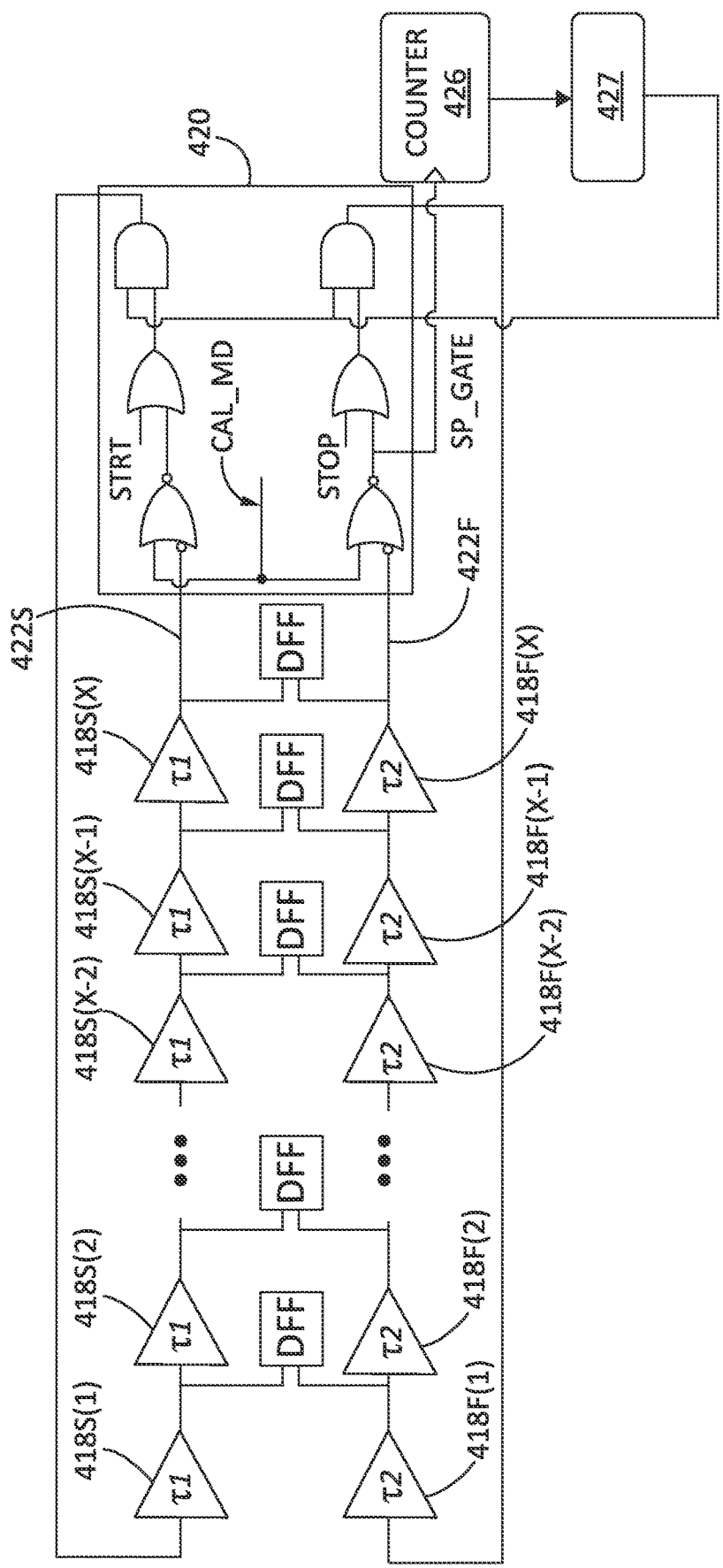
FIG. 4B is a schematic diagram illustrating operation of a Vernier circuit in the TDC circuit in FIG. 4A, including a feedback circuit to feedback outputs of the serially coupled delay circuits to inputs of the serially coupled delay circuits in a calibration operating mode.

In this regard, FIG. 4B shows serially coupled delay circuits 418S(1)-418S(X) and serially coupled delay circuits 418F(1)-418F(X) employed in the TDC 406. The serially coupled delay circuits 418S(1)-418S(X) and serially coupled delay circuits 418F(1)-418F(X) may be the serially coupled delay circuits 302S(1)-302S(X) and serially coupled delay circuits 302F(1)-302F(X). The TDC 406 also includes a wrap circuit 420 configured to, in the calibration operating mode, feedback an output 422S of the serially coupled delay circuit 418S(X) to an input 424S of the serially coupled delay circuit 418S(1) and feedback an output 422F of the serially coupled delay circuit 418F(X) to an input 424F of the serially coupled delay circuit 418F(1). In addition, the TDC 406 in FIG. 4B includes a counter 426 to track a number of iterations or "laps" indicating the stop signal STOP is fed back from the output 422F to the input 424F of the serially coupled delay circuit 418F(1). Reset circuit 427 is employed to stop the feedback through the wrap circuit 420 when the measurement 416 is completed.

Figure 4C:
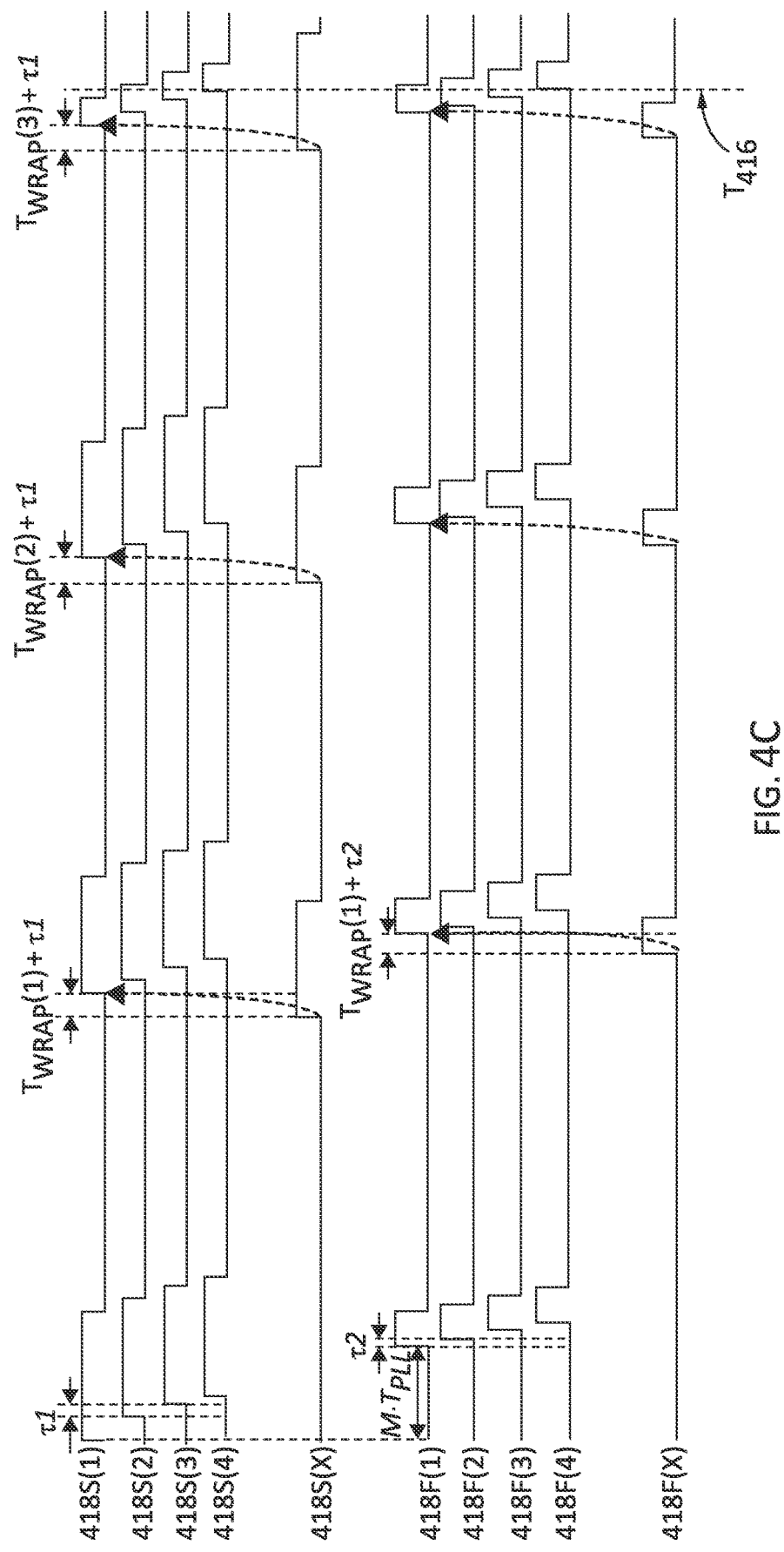
FIG. 4C is a timing diagram illustrating the timing of the start and stop signals in the serially coupled delay circuits in FIG. 4B during multiple iterations of feedback through the feedback circuit.

FIG. 4C illustrates an example of the start signal STRT as a pulse propagating through the serially coupled delay circuits 418S(1)-418S(X) and the stop signal STOP as a pulse propagating through the serially coupled delay circuits 418F(1)-418F(X). The leading or rising edges of the start signal STRT on outputs of the serially coupled delay circuits 418S(1)-418S(X) are separated in time by the propagation delay τ1 through each of the serially coupled delay circuits 418S(1)-418S(4). Also shown are wrap delays $T_{WRAP}(1)$, $T_{WRAP}(2)$, and $T_{WRAP}(3)$ from the serially coupled delay circuit 418S(X) through the wrap circuit 420 as the start signal STRT takes three laps through the serially coupled delay circuits 418S(1)-418S(X). The start signal STRT may wrap back any number of times, and each lap may be counted by the counter 426.

Similarly, FIG. 4C shows the rising edges of the stop signal STOP on outputs of the serially coupled delay circuits 418F(1)-418F(X) separated in time by the propagation delay τ2 through the serially coupled delay circuits 418F(1)-418F(4). The stop signal STOP has the same propagation delays $T_{WRAP}(1)$, $T_{WRAP}(2)$, and $T_{WRAP}(3)$ through the wrap circuit 420 in the feedback to the serially coupled delay circuit 418F(1) as the propagation delay of the start signal STRT. The stop signal STOP catches up the start signal STRT at time $τ_{416}$, at which point the measurement 416 is generated. In this manner, the wrap circuit 420 and counter 426 make it possible for the TDC 406 to measure a time interval $M·T_{PLL}$ that is greater than the maximum measurable time $T_{MAX}$ that can be measured in the normal operating mode and the resulting measurement has the same resolution $TDC_{RES}$ as in the normal operating mode.

Referring back to FIGS. 4A and 4B, in addition to the capability to measure a larger time interval, the TDC 406 also includes a calibration interval generator (CIG) circuit 428 configured to generate a calibration reference signal CAL_REF and a calibration feedback signal CAL_FB separated by a calibration interval CAL_INT, which is a time interval that may be equal to or more than a multiple of the maximum measurable time $T_{MAX}$ in the normal operating mode. Details of the CIG circuit 428 are described with reference back to FIG. 4A. The CIG circuit 428 is triggered to operate in response to a calibration enable signal CAL_EN. The calibration enable signal CAL_EN is provided to a pulse generator 429 that generates a calibration mode signal CAL_MD, which is the indication that the DPLL 400 is in the calibration operating mode. While the calibration enable signal CAL_EN is active, the calibration mode signal CAL_MD may be activated periodically where each instance of the calibration mode signal CAL_MD activation is long enough to perform the method of calibration of the resolution $TDC_{RES}$ of the TDC 406 described herein. In some examples, the calibration method may be performed repeatedly while the calibration mode signal CAL_MD is active.

The CIG 428 also includes a second divider circuit 430 that receives and divides the output clock CLK_OUT from the DCO 402 to generate a calibration clock signal CAL_DIV having a lower frequency than the frequency $F_{PLL}$ of the output clock CLK_OUT. Thus, the second divider circuit 430 can generate the calibration clock signal CAL_DIV having a period $M·T_{PLL}$, which is a multiple (M) of the period $T_{PLL}$ of the output clock CLK_OUT, and the multiple M may be configurable. In this way, the CIG circuit 428 can use the second divider circuit 430 to generate the calibration clock signal CAL_DIV with a clock period that corresponds to a desired calibration interval CAL_INT for calibrating the resolution $TDC_{RES}$, which may be measured as described above with reference to FIG. 4B.

In further detail, the CIG 428, in this example, includes D flip-flops (DFFs) 432 and 434 to provide the calibration reference signal CAL_REF and the calibration feedback signal CAL_FB, as follows. The DFF 432 receives the feedback clock CLK_FB from the divider circuit 408 and the DFF 434 receives the output of the DFF 432. The calibration clock signal CAL_DIV is provided to both DFFs 432 and 434. Thus, while the feedback clock CLK_FB is in an active state (e.g., "1"), a first rising edge of the calibration clock signal CAL_DIV will cause the DFF 432 to transition to an active ("1") state. A second rising edge of the calibration clock signal CAL_DIV will cause the feedback clock CAL_FB from the DFF 434 to transition to an active ("1") state. These transitions, of the calibration reference signal CAL_REF and the calibration feedback signal CAL_FB, are separated in time by the period $M \cdot T_{PLL}$, which is referred to as a calibration time interval CAL_INT. In the calibration operating mode indicated by the calibration mode signal CAL_MD, the calibration reference signal CAL_REF and the calibration feedback signal CAL_FB are provided to the PFD 410 by multiplexors 435R and 435F. Specifically, in the calibration operating mode, the calibration reference signal CAL_REF is provided to a reference signal input 437R of the PFD 410 and the calibration feedback signal CAL_FB is provided to a feedback signal input 437F of the PFD 410. In the normal operating mode, the reference clock CLK_REF is provided to the reference signal input 437R and the feedback clock CLK_FB is provided to the feedback signal input 437F. During calibration, the PFD 410 will generate the start signal STRT and the stop signal STOP separated by the calibration time interval CAL_INT. For reasons described above, the calibration time interval CAL_INT may be larger than a multiple of the maximum measured time $T_{MAX}$.

The feedback circuit 404 also includes a resolution adjustor circuit 436 that receives and holds the measurement 416 in a storage circuit 417 with a multiplexor 419 and, in the calibration mode, a comparator 421 compares the measurement 416 to a measurement 438 of the calibration time interval CAL_INT based on the nominal resolution $NOM_{RES}$. In other words, the resolution adjustor circuit 436 compares the multiples J and K discussed above. A result 440 of the comparison indicates whether the resolution $TDC_{RES}$ needs to be adjusted (e.g., if J≠K). The result 440 may be accumulated in an accumulator 442 over multiple calibration modes. The accumulator 442 generates a resolution control signal 444 to the TDC 406 to adjust (increase or decrease) the resolution $TDC_{RES}$ as needed to bring the resolution $TDC_{RES}$ closer to the nominal resolution $NOM_{RES}$. As described with reference to FIG. 3, the resolution control signal 444 may be adjusting variable capacitors coupled to the serially coupled delay circuits 418S(1)-418S(X) and/or the serially coupled delay circuits 418F(1)-418F(X).

The feedback circuit 404 also includes storage circuits 446 and 448 and a multiplexor 450. The storage circuit 446 stores the calibration mode signal CAL_MD. The storage circuit 448 stores the measurement 416 that was generated in the TDC 406 before activation of the calibration mode signal CAL_MD and the multiplexor 450 determines, based on the calibration mode signal CAL_MD, whether to update the measurement 416 (in the normal operating mode) or keep the measurement 416 constant (in the calibration operating mode).

Figure 5:
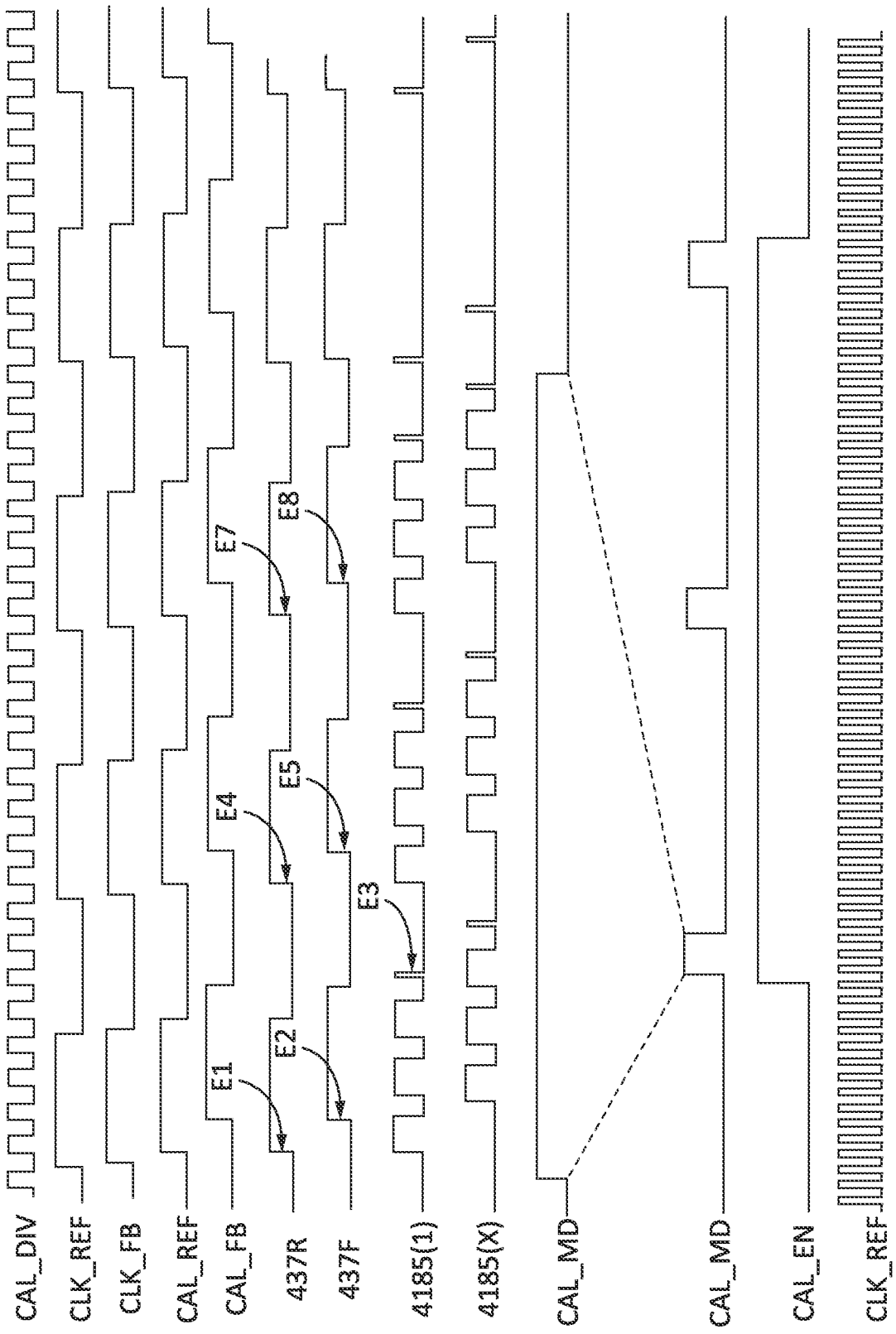
FIG. 5 is a timing diagram illustrating signals in the calibrated DPLL circuit in FIG. 4A during a calibration operating mode.

FIG. 5 is another illustration of signals in the feedback circuit 404 during the calibration operating mode illustrated in FIG. 4C. While the calibration enable signal CAL_EN is active, the calibration mode signal CAL_MD may be activated periodically by the pulse generator 429. As shown in FIG. 4C and FIG. 5, the calibration method described above may be performed multiple times during the calibration operating mode. In the first instance, the calibration time interval CAL_INT begins at rising edge E1 of the reference signal input 437R and ends at rising edge E2 of the feedback signal input 437F. A measurement of the calibration time interval CAL_INT is generated at edge E3 after more than three laps of the stop signal STOP through the serially coupled delay circuits 418S(1)-418S(X). As long as the calibration mode signal CAL_MD continues to be active (i.e., the DPLL 400 is still in the calibration operating mode), another calibration time interval CAL_INT is generated, as shown from edge E4 to E5 and again from edge E7 to E8 and the measurement process is repeated.

FIG. 6 is a flow chart illustrating a method 600 of calibration of the TDC 406 in the DPLL 400 in FIG. 4A. The method includes generating, in a digitally controlled oscillator (DCO) circuit 402, a first output clock CLK_OUT having a first frequency $F_{PLL}$ based on a control value 414 (block 602). The method further includes, in a feedback circuit 404 (block 604), in a normal operating mode (block 606), generating a first measurement 416 of a first time interval corresponding to a phase difference between the first output clock CLK_OUT and a reference clock CLK_REF (block 608) and updating the control value 414 based on the first measurement 416 (block 610). The method further includes, in the feedback circuit 404, in a calibration operating mode (block 612), keeping the control value 414 constant (block 614) and adjusting a first resolution $TDC_{RES}$ of the first measurement 416 to be closer to a nominal resolution $NOM_{RES}$ (block 616).

FIG. 7 is a block diagram of an exemplary processor-based system 700 that includes a processor 702 (e.g., a microprocessor), including an instruction processing circuit 704. The processor-based system 700 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 700 includes the processor 702. The processor 702 represents one or more general-purpose processing circuits, such as a microprocessor, central processing unit, or the like. More particularly, the processor 702 may be an EDGE instruction set microprocessor or other processor implementing an instruction set that supports explicit consumer naming for communicating produced values resulting from execution of producer instructions. The processor 702 is configured to execute processing logic in instructions for performing the operations and steps discussed herein. In this example, the processor 702 includes an instruction cache 706 for temporary, fast access memory storage of instructions accessible by the instruction processing circuit 704. Fetched or prefetched instructions from a memory, such as a main memory 708, over a system bus 710, are stored in the instruction cache 706. Data may be stored in a cache memory 712 coupled to the system bus 710 for low-latency access by the processor 702. The instruction processing circuit 704 is configured to process instructions fetched into the instruction cache 706 and process the instructions for execution.

The processor 702 and the main memory 708 are coupled to the system bus 710 and can intercouple peripheral devices included in the processor-based system 700. As is well known, the processor 702 communicates with these other devices by exchanging address, control, and data information over the system bus 710. For example, the processor 702 can communicate bus transaction requests to a memory controller 714 in the main memory 708 as an example of a slave device. Although not illustrated in FIG. 7, multiple system buses 710 could be provided; wherein each system bus 710 constitutes a different fabric. In this example, the memory controller 714 is configured to provide memory access requests to a memory array 716 in the main memory 708. The memory array 716 is comprised of an array of storage bit cells for storing data. The main memory 708 may be a read-only memory (ROM), flash memory, dynamic random-access memory (DRAM), such as synchronous DRAM (SDRAM), etc. and/or static memory (e.g., flash memory, SRAM, etc.), as non-limiting examples.

Other devices can be connected to the system bus 710. As illustrated in FIG. 7, these devices can include the main memory 708, one or more input device(s) 718, one or more output device(s) 720, a modem 722, and one or more display controllers 724, as examples. The input device(s) 718 can include any type of input device, including but not limited to input keys, switches, voice processors, etc. The output device(s) 720 can include any type of output device, including but not limited to audio, video, other visual indicators, etc. The modem 722 can be any device configured to allow an exchange of data to and from a network 726. The network 726 can be any type of network, including but not limited to a wired or wireless network, a private or public network, a local area network (LAN), a wireless local area network (WLAN), a wide area network (WAN), a BLUETOOTH™ network, and the Internet. The modem 722 can be configured to support any type of communications protocol desired. The processor 702 may also be configured to access the display controller(s) 724 over the system bus 710 to control information sent to one or more displays 728. The display(s) 728 can include any type of display, including but not limited to a cathode ray tube (CRT), a liquid crystal display (LCD), a plasma display, etc.

The processor-based system 700 in FIG. 7 may include a set of instructions 730 to be executed by the processor 702 for any application desired according to the instructions. The instructions 730 may be stored in the main memory 708, processor 702, and/or instruction cache 706 as examples of a non-transitory computer-readable medium 732. The instructions 730 may also reside, completely or at least partially, within the main memory 708 and/or within the processor 702 during their execution. The instructions 730 may further be transmitted or received over the network 726 via the modem 722, such that the network 726 includes computer-readable medium 732.

Any of the circuits in the processor-based system 700, and in particular the modem 722 and the output devices 720, may include multiple clock domains, each including a calibrated DPLL that includes a feedback circuit configured to calibrate a resolution of a TDC to a nominal resolution in a closed-loop method, to normalize responses in the DPLLs across multiple clock domains of the IC, as illustrated in FIGS. 3, 4A, and 4B.

While the computer-readable medium 732 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or a computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.), and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips that may be referenced throughout the above description may be represented by voltages, currents, electromagnetic waves, magnetic fields, optical fields, or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A calibrated digital phase-locked loop (DPLL), comprising:
    a digitally controlled oscillator (DCO) circuit configured to generate a first output clock having a first frequency based on a control value; and
    a feedback circuit configured to:
        in a normal operating mode:
            generate a first measurement of a first time interval corresponding to a phase difference between the first output clock and a reference clock; and
            update the control value based on the first measurement; and
        in a calibration operating mode:
            keep the control value constant; and
            adjust a first resolution of the first measurement to be closer to a nominal resolution.

2. The calibrated DPLL of claim 1, wherein the feedback circuit is further configured to:
    in the normal operating mode, generate the first measurement in a range having a maximum value comprising a first multiple of the first resolution; and
    in the calibration operating mode:
        generate a second measurement of a second time interval greater than the first time interval, wherein the second measurement comprises a second multiple of the first resolution and the second multiple is greater than the first multiple; and
        compare the second measurement to a third measurement of the second time interval, the third measurement comprising a third multiple of the nominal resolution.

3. The calibrated DPLL of claim 2, wherein the second multiple is at least two times the first multiple.

4. The calibrated DPLL of claim 2, wherein:
    the feedback circuit further comprises:
        a first clock divider configured to divide the first output clock to generate a feedback clock having a second frequency lower than the first frequency;
        a phase frequency detector (PFD) comprising:
            a first PFD input configured to receive a reference signal; and
            a second PFD input configured to receive a feedback signal;
            wherein the PFD is configured to generate a start signal and a stop signal separated by an amount of time based on a phase difference between the reference signal and the feedback signal; and
        a time-to-digital converter (TDC) circuit comprising:
            serially coupled first delay circuits each having a first propagation delay and configured to propagate the start signal;
            serially coupled second delay circuits each having a second propagation delay, shorter than the first delay, and configured to propagate the stop signal; and
            a TDC output configured to generate a time measurement of an amount of time separating the start signal and the stop signal as the control value;
    wherein:
        in the normal operating mode:
            the reference signal comprises the reference clock;

the feedback signal comprises the feedback clock;

the time measurement comprises the first measurement;

a first resolution of the time measurement comprises a difference between the first propagation delay and the second propagation delay; and the first multiple corresponds to a number of first delay circuits in the serially coupled first delay circuits.

5. The calibrated DPLL of claim 4, wherein the feedback circuit further comprises a delay feedback circuit configured to, in the calibration operating mode:

feedback an output of the serially coupled first delay circuits to an input of the serially coupled first delay circuits; and feedback an output of the serially coupled second delay circuits to an input of the serially coupled second delay circuits.

6. The calibrated DPLL of claim 5, wherein the feedback circuit further comprises a lap counter configured to increment each time the output of the serially coupled second delay circuits is fed back to the input of the serially coupled second delay circuits.

7. The calibrated DPLL of claim 4, wherein:

the feedback circuit further comprises a value register configured to store the control value; and the value register is configured to:

in the normal operating mode, update the control value based on the time measurement and store the updated control value; and in the calibration operating mode, feedback a stored control value to keep the control value constant.

8. The calibrated DPLL of claim 4, further comprising a resolution adjustor circuit configured to, in the calibration operating mode:

store the time measurement generated on the TDC output;

compare the time measurement having the first resolution to a predetermined time measurement of the time separating the start signal and the stop signal having the nominal resolution; and generate a resolution adjustment signal to adjust the first resolution.

9. The calibrated DPLL of claim 8, wherein the resolution adjustment signal is configured to update at least one of the first propagation delay and the second propagation delay.

10. The calibrated DPLL of claim 8, further comprising a calibration mode indication circuit configured to periodically generate a calibration mode indicator indicating the calibration mode in response to a calibration enable signal.

11. The calibrated DPLL of claim 10, wherein the resolution adjustor circuit is configured to accumulate results of comparing the time measurement and the predetermined time measurement in respective instances of the calibration mode to generate the resolution adjustment signal.

12. The calibrated DPLL of claim 4, further comprising a calibration interval generator circuit configured to, in the calibration mode, provide a calibration reference signal on the first PFD input and a calibration feedback signal on the second PFD input, wherein the calibration reference signal and the calibration feedback signal are separated in time by the second time interval.

13. The calibrated DPLL of claim 12, further comprising a second clock divider configured to divide the first output clock to generate a test clock having a test clock period, wherein the second time interval is based on the test clock period.

14. A method of operating a calibrated digital phase-locked loop (DPLL), comprising:

generating, in a digitally controlled oscillator (DCO) circuit, a first output clock having a first frequency based on a control value; and in a feedback circuit:

in a normal operating mode:

generating a first measurement of a first time interval corresponding to a phase difference between the first output clock and a reference clock; and updating the control value based on the first measurement; and in a calibration operating mode:

keeping the control value constant; and adjusting a first resolution of the first measurement to be closer to a nominal resolution.

15. The method of claim 14, further comprising:

in the normal operating mode, generating the first measurement in a range having a maximum value comprising a first multiple of the first resolution; and in the calibration operating mode:

generating a second measurement of a second time interval greater than the first time interval, wherein the second measurement comprises a second multiple of the first resolution and the second multiple is greater than the first multiple; and comparing the second measurement to a third measurement of the second time interval, the third measurement comprising a third multiple of the nominal resolution.

16. The method of claim 15, further comprising:

dividing the first output clock to generate a feedback clock having a second frequency lower than the first frequency;

generating, in a phase frequency detector, a start signal and a stop signal separated by an amount of time based on a phase difference between a reference signal and a feedback signal; and generating a time measurement of an amount of time separating the start signal and the stop signal as the control value;

wherein in the normal operating mode, the amount of time separating the start signal and the stop signal is based on a phase difference between the reference clock and the feedback clock.

17. The method of claim 16, further comprising:

in the normal operating mode, updating the control value based on the time measurement and storing the updated control value; and in the calibration operating mode, feeding back a stored control value to keep the control value constant.

18. The method of claim 16, further comprising, in the calibration operating mode:

storing the time measurement;

comparing the time measurement having the first resolution to a predetermined time measurement of the time separating the start signal and the stop signal having the nominal resolution; and generating a resolution adjustment signal to adjust the first resolution.

19. The method of claim 14, further comprising periodically generating a calibration operating mode indicator indicating the calibration mode in response to a calibration enable signal.

20. The method of claim 18, further comprising accumulating results of comparing the time measurement and the predetermined time measurement in respective instances of the calibration mode to generate the resolution adjustment signal.

21. The method of claim 15, further comprising, in the calibration mode, providing a test reference signal as the reference signal and providing a test feedback signal as the feedback signal, wherein the test reference signal and the test feedback signal are separated in time by the second time interval.

22. The method of claim 21, further comprising dividing the output clock to generate a calibration clock having a calibration clock period, wherein the second time interval is based on the calibration clock period.

23. An integrated circuit (IC), comprising a plurality of clock domains each comprising:
   a calibrated digital phase-locked loop (DPLL), comprising:
      a digitally controlled oscillator (DCO) circuit configured to generate a first output clock having a first frequency based on a control value; and
      a feedback circuit configured to:
         in a normal operating mode:
            generate a first measurement of a first time interval corresponding to a phase difference between the first output clock and a reference clock; and
            update the control value based on the first measurement; and
         in a calibration operating mode:
            keep the control value constant; and
            adjust a first resolution of the first measurement to be closer to a nominal resolution; and
   a plurality of digital logic circuits configured to operate in response to the first output clock,
wherein the plurality of digital logic circuits of a first clock domain of the plurality of clock domains are configured to communicate with the plurality of digital logic circuits of a second clock domain of the plurality of clock domains.

* * * * *